United States Patent [19]

Van Horn

[11] Patent Number: 4,885,799
[45] Date of Patent: Dec. 5, 1989

[54] LOAD PULL ISOLATION SWITCH FOR A FAST LOCKING SYNTHESIZER

[75] Inventor: Mark I. Van Horn, Bedford, Tex.
[73] Assignee: Motorola, Inc., Schaumburg, Ill.
[21] Appl. No.: 69,796
[22] Filed: Jul. 1, 1987
[51] Int. Cl.⁴ .......................... H04B 1/44; H01P 1/10; H03G 9/00
[52] U.S. Cl. ...................... 455/78; 455/83; 307/39; 307/116; 333/101
[58] Field of Search .................... 455/78–83, 455/54, 300, 127; 333/101, 103, 105; 307/30, 39

[56] References Cited

U.S. PATENT DOCUMENTS

| | | | |
|---|---|---|---|
| 3,891,947 | 6/1975 | Debost et al. | 455/83 X |
| 3,958,186 | 5/1976 | Jesse et al. | 455/113 X |
| 4,028,645 | 6/1977 | Tressa | 455/80 X |
| 4,106,025 | 8/1978 | Katz | 455/74 X |
| 4,158,814 | 6/1979 | Imazeki et al. | 455/78 |
| 4,161,695 | 7/1979 | Kakigi | 455/78 X |
| 4,361,905 | 11/1982 | Etherington et al. | 455/80 |
| 4,371,851 | 2/1983 | Niehenke et al. | 455/80 X |
| 4,380,822 | 4/1983 | Broton | 455/80 |
| 4,481,641 | 11/1984 | Gable et al. | 455/78 X |
| 4,498,056 | 2/1985 | Kwitkowski et al. | 330/296 |
| 4,501,017 | 2/1985 | Higgins et al. | 455/78 |
| 4,637,065 | 1/1987 | Ruppel | 455/78 |
| 4,637,073 | 1/1987 | Selin et al. | 455/78 |
| 4,641,365 | 2/1987 | Montini, Jr. | 455/78 |
| 4,675,863 | 6/1987 | Paneth et al. | 455/33 X |
| 4,718,110 | 1/1988 | Schaefer | 455/90 |

*Primary Examiner*—Thomas H. Tarcza
*Assistant Examiner*—John B. Sotomayor
*Attorney, Agent, or Firm*—Wayne J. Egan; Ronald G. Wesoloski

[57] ABSTRACT

A load pull isolation switch for a signal source is discolsed which substantially eliminates the effects of load pull caused by a variable impedance load when selectively coupled and decoupled to a signal source. By judiciously choosing the timing criteria for activating the isolation switch, convention load pull isolation stages are eliminated.

In another embodiment, the load pull isolation switch is disclosed as incorporated in a mobile radio having a fast locking synthesizer. The timing of the operation of the isolation switch is controlled by a microprocessor-controller which not only handles data and control functions for the mobile radio, but also has the necessary method steps incorporated as software within the microprocessor-controller. Such an arrangement is useful for sending voice or data as in a time division multiplex system.

10 Claims, 4 Drawing Sheets

LOAD PULL ISOLATION SWITCH FOR A FAST LOCKING SYNTHESIZER

BACKGROUND OF THE INVENTION

The present invention relates generally to signal source isolation stages. More particularly, this invention relates to solid state radio frequency isolation switches for mobile radio transceivers.

There are many applications where it is necessary to provide isolation for a signal source before coupling to a load having a given terminating impedance. One such application is in a mobile radio transceiver where minimal load-pull for an included variable-frequency programmable synthesizer is desired when selectively keying or de-keying a radio frequency (RF) transmittor thereof. When the mobile radio is keyed up for transmit, the voltage controlled oscillator (VCO) portion of the signal source is switched to the transmit frequency and the RF power amplifier (PA) stages are activated, or biased on. As the PA stages are biased on, the input impedance changes rapidly and "pulls" the VCO off frequency. This effect is commonly referred to as "load-pull".

Several techniques for providing isolation between a signal source and a variable impedance load in order to minimize load-pull are known. One commonly used arrangement imploys one or more high performance buffer stages to reduce the effects of the variable input impedance presented by the input to the RF PA as it is keyed up. Although this arrangement does reduce the effects of the variable load being presented to the signal source, the arrangement suffers from additional current drain and sets a limit as to how fast the mobile radio is able to transmit when given a command to do so. Such a limitation is of great consequence when designing mobile radios to operate in a high speed manner, such as for high speed data systems or for time-division-multiplex communication systems.

Several techniques for providing a load isolation function are known. One such arrangement imploys one or more buffer stages which help reduce the variation in load impedance presented to the signal source in order to maintain terminating impedance at a desired value. Although this arrangement is able to reduce the amount of variation in the load impedance presented to the signal source, it suffers from the disadvantage of trading off additional current consumption for each additional buffer stage added to improve the isolation further.

Solid state switches provide an attractive alternative to the foregoing buffer stage arrangement. Many such solid state switch arrangements are known, especially with regard to PIN diode transmit-receive switching networks. One known arrangement utilizing a PIN diode switching network in conjunction with several high performance buffer stages is the UHF Syntor-X radio available from Motorola Inc. However, in that arrangement, the circuit timing is such that the PIN diode switch is turned on immediately before transmitting and the PA is not biased on until the VCO is locked onto the transit frequency, leaving the load pull problem to be dealt with through the use of high performance buffer stages.

The present invention solves the above-mentioned problems by utilizing different timing of the PIN diode switch in conjunction with the key-up of the RF power amplifier without the use of buffer stages for isolation.

This invention represents a significant advance over the prior art by providing an isolation switch arrangement in which the effect of load-pull is practically eliminated for the VCO within the frequency synthesizer signal source.

SUMMARY OF THE INVENTION

It is an object of the present invention to provide an isolation switch arrangement for a signal source which practically eliminates load-pull caused by a variable impedance load.

In practicing one form of the invention, there is provided a signal source selectively coupled to a first load, having a fixed terminating impedance of the desired value, or a second load, having an impedance which is variable about a desired value. This signal diversion results from first and second conductive states in response to a control signal from a sensor, or controller, which senses at least that the variable load has settled to a value very nearly equal to the desired impedance value before effecting the second conductive state.

Thus, there has been provided an isolation switch for minimizing load-pull by providing nearly undisturbed terminating impedance for the signal source. These and other objects of the present invention will become apparent to those skilled in the art upon consideration of the accompanying specification, claims, and drawings.

BRIEF DESCRIPTION OF THE DRAWINGS

Referring to the drawings, wherein like reference numerals indicate like elements in the several figures and in which.

DETAILED DESCRIPTION OF THE PREFERRED EMBODIMENT

Figure 1:
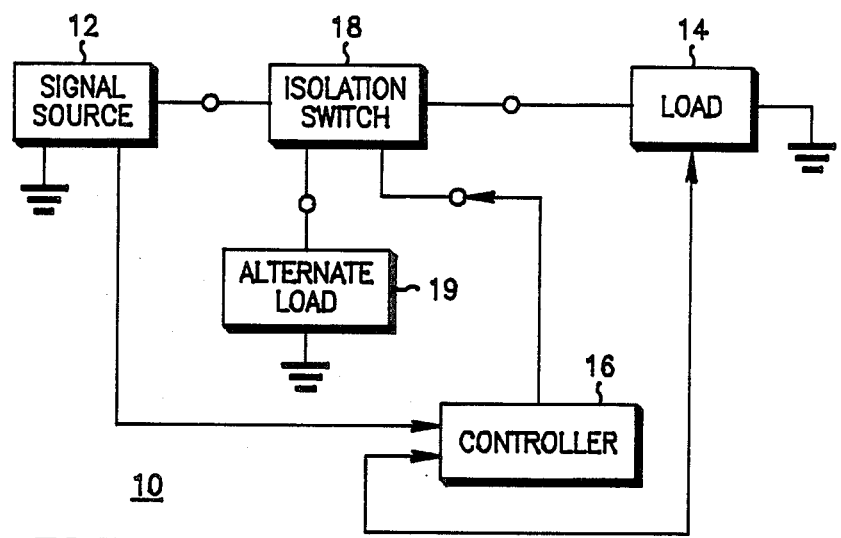
FIG. 1 illustrates a block diagram of the simplest form of the present invention.

Referring now to the drawings, a basic isolation switch arrangement for a signal source is shown at 10 in FIG. 1. This arrangement includes a signal source 12, a variable impedance load 14, a controller 16, isolation switch 18 interposed between the signal source 12 and load 14, as shown. Alternate load 19 is coupled to isolation switch 18 and provides a fixed termination impedance. Controller 16 senses when variable impedance load 14 has changed between at least 2 states as well as sensing when the frequency of the signal source 12 has settled to the proper frequency before activating switchover via the isolation switch 18 from the alternate load 9 to the load 14. This is best seen in FIG. 2 at 20.

Figure 2:
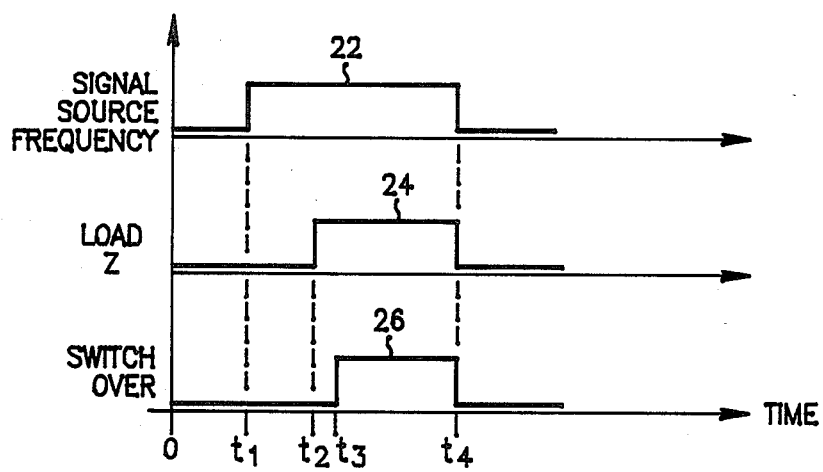
FIG. 2 is a timing diagram illustrating the sequence of the method of the present invention.

FIG. 2 depicts a timing diagram at 20 which is applicable to a first embodiment of the present invention depicted at 10 in FIG. 1. The signal source 12 may be arranged to switch between at least two frequencies such that at time $t_1$ the signal source 12 settles to the desired frequency represented by line 22. The load impedance variation is represented by curve 24 for load 14, in which at time $t_2$ the load changes from a first to a second value of impedance. Upon sensing that both the signal source frequency represented by line 22 and the load impedance represented by line 24 have reached values very nearly equal to their proper values, controller 16 next commands the isolation switch 18 to effect switchover at time $t_3$ from alternate load 19 to the load 14, as represented by line 26 of FIG. 2. Time $t_4$ represents the point at which the signal source is decoupled from the variable load 14. Although the timing diagram of FIG. 2 is a simplification of the basic arrangement of FIG. 1, it is to be understood that the signal source 12 may include a programmable multi-frequency synthesizer having two or more frequencies, or alternately may merely include a single frequency oscillator. In the latter case, controller 16 need only sense that the load impedance represented by line 24 has reached a value very nearly equal to the desired value. Furthermore, isolation switch 18 may take the form of a low loss PIN diode switching arrangement, such as depicted in FIG. 3 at 30, or simply as a coaxial relay as depicted in FIG. 4 at 40.

Figure 3:
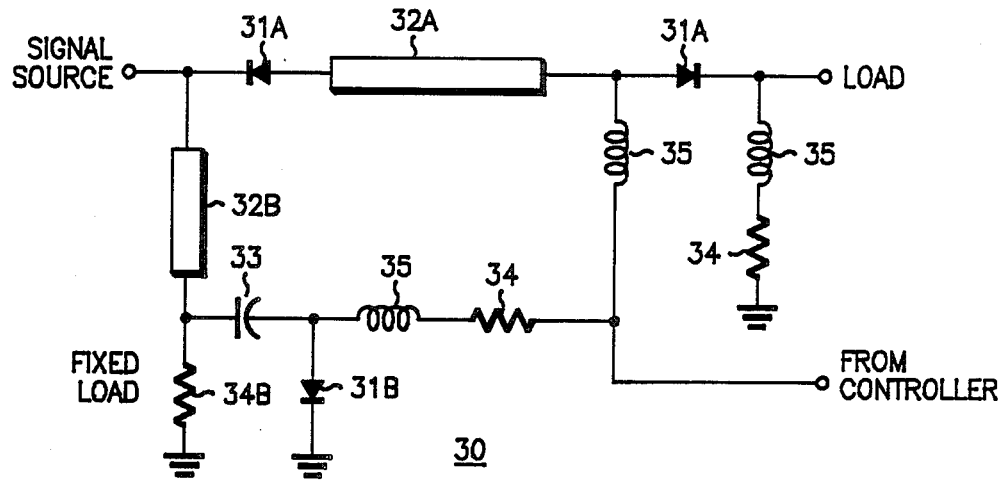
FIG. 3 illustrates one form of a solid state signal diversion switch for effecting the isolation switch of FIG. 1.

FIG. 3 at 30 depicts one such PIN diode switching arrangement, which includes a series signal branch having at least two semiconductive devices, such as PIN diodes 31a, and a first quarter-wavelength transmission line 32a having a characteristic impedance to interface to the characteristic impedance of the signal source and load, usually about 50 ohms. The shunt signal branch consists of at least one semiconductive device, such as PIN diode 31b and a second quarter-wavelength transmission line 32b, having a similar characteristic impedance as the signal source, and coupling capacitor 33 coupled between PIN diode 31b and quarter-wavelength transmission line 32b. Various resistors 34 are incorporated to provide current limiting for the PIN diodes therein, while 34b represents the fixed load to the isolation switch. Isolation of a 50 milliwatt signal is typically better than 0.1 milliwatt, and insertion loss is typically 0.3 dB. Also included are various decoupling chokes 35, incorporated as part of the bias network for the isolation switch.

Figure 4:
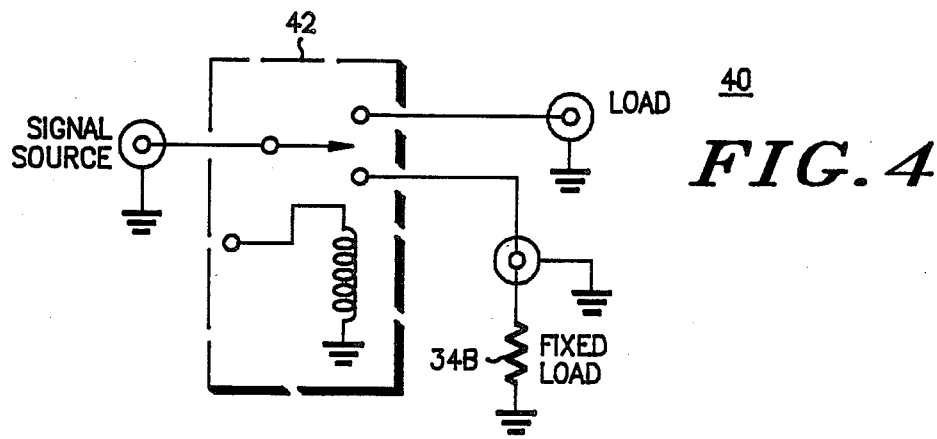
FIG. 4 illustrates an alternate embodiment of the isolation switch in the form of a coaxial relay.

FIG. 4 depicts at 40 a coaxial relay switch 42 as an alternate realization of the isolation switch 18 of FIG. 1.

Figure 5:
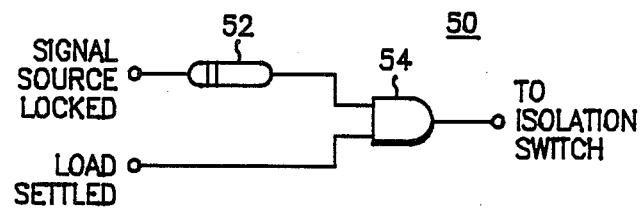
FIG. 5 illustrates a simple hardware implementation of the sensing means, or controller, of FIG. 1.

FIG. 5 depicts at 50 a logic circuit configured to sense when the load has settled to a value very nearly equal to the desired impedance value and when the signal source has locked, or settled to a pre-determined frequency, via time delay 52 and AND gate 54. Time delay 52 is set to approximately equal the signal source settling time, depicted as the time interval between $t_1$ to $t_3$ of FIG. 2. Each of these elements is easily implemented by one of skill in the art.

Figure 6:
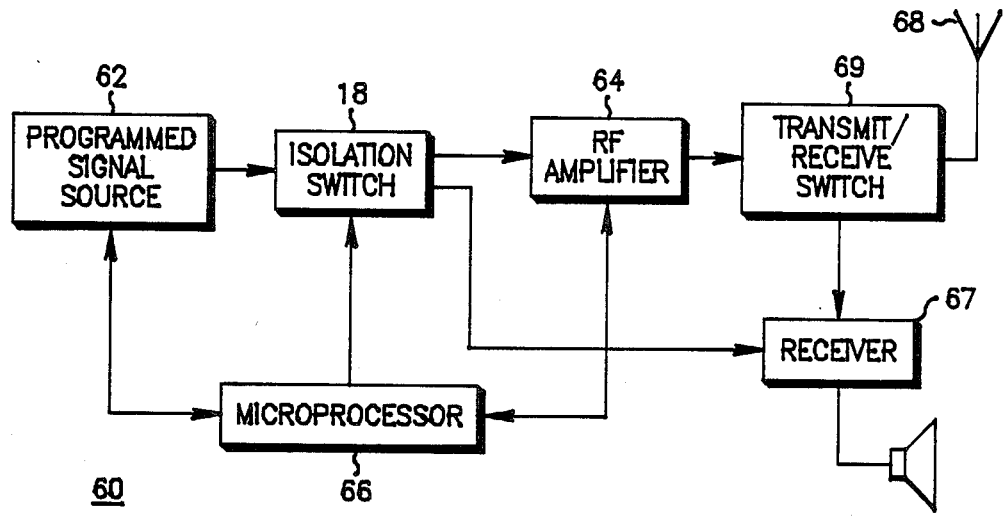
FIG. 6 illustrates a mobile radio incorporating the present invention, having a programmable signal source and utilizing a microprocessor for handling data signals as well as performing the functions of the sensor-controller of FIG. 1.

FIG. 6 depicts a mobile radio having a transmittor and receiver incorporated therein which includes the present invention. As shown, programmable signal source 62, which preferrably is a fast-locking frequency synthesizer suitable for time division multiplex radio communication systems applications, couples through isolation switch 18 to an RF power amplifier 64, as the variable impedance load. A microprocessor-controller 66 is utilized to command the programable signal source 62 to change frequency and to command the RF power amplifier 64 to become keyed during transmit of either voice or data. The data is handled by additional data stages which are included in the microprocessor controller stage 66. Controller 66 also controls the operation of isolation switch 18 which has an alternate path to a fixed load represented by a local oscillator injection stage within receiver 67. Radio signals handled by antenna 68 are directed to or from transmit receive switch 69, which effects coupling of the antenna depending on the transmit-receive mode.

Figure 7:
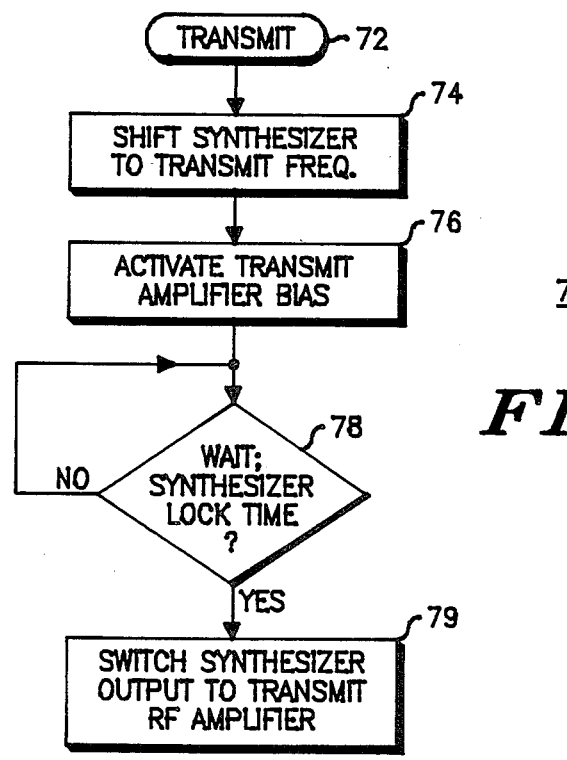
FIG. 7 is a flowchart of the exemplary method utilized by the microprocessor-controller depicted in FIG. 6.

FIG. 7 depicts at 70 a flow chart for use in controlling the method steps of the microprocessor controller 66 of FIG. 6. According to this method, starting at block 72 representing the beginning of the transmit mode, the method then commands the programmed signal source 62 to shift to the transmit frequency, as represented at box 74. Next, the controller activates amplifier bias as represented at block 76 for RF power amp 64. Then, the method waits a pre-determined time to allow for lock time, as represented by block 78. Finally, the method then allows the isolation switch to direct the programmable signal source, or synthesizer, to direct it's output to the RF power amplifier, as represented by block 79.

Figure 8:
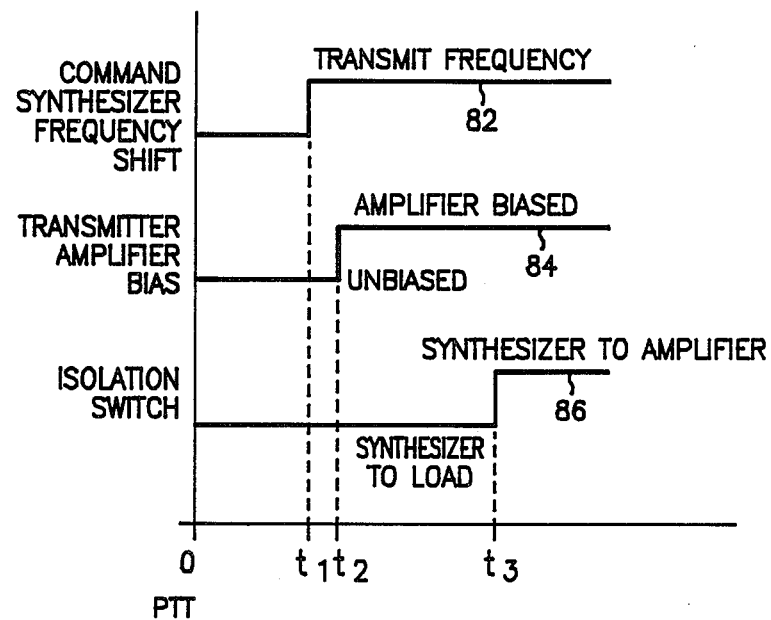
FIG. 8 is a timing diagram illustrating the method sequence steps illustrated in the flowchart of FIG. 7.

The timing diagram depicted at 80 in FIG. 8 is directed to the control of isolation switch 18 as utilized in the mobile radio depicted at 60 in FIG. 6. In this embodiment, at some time $t_1$ after an initial push to talk (PTT) command initializing the transmit mode is given, the command is given to shift the synthesizer frequency, as represented by curve 82. Next, at some other time $t_2$, which may be at the same time or later than $t_1$, the RF power amp transmitter is biased on as shown by curve 84. Finally, the isolation switch is directed to decouple from the fixed imedance load, represented by receiver 67 of FIG. 6, to the variable impedance load, represented by RF power amplifier 64, and as shown by curve 86. It is important to note that the time interval $t_3-t_1$ should be sufficiently long to allow for the synthesizer lock time. That is, from the time the command is given for the synthesizer frequency to shift, until that frequency is achieved, the programmable signal source should remain isolated from the variable impedance load represented by the RF power amp 64.

Thus, there ha been provided a load pull isolation switch for a fast locking synthesizer, which is suitable for use in a system requiring a fast locking transmit signal for sending voice or data messages. Further, there has been provided a isolation switch exhibiting greatly reduced load pull while eliminating costly additional isolation stages. Thus, each of the above mentioned arrangements is able to overcome the limitations of the known art.

Although the several load pull isolation switch arrangements of the present invention fully disclose many of the attendant advantages, it is understood that various changes in modifications not depicted herein are apparent to those skilled in the art. Therefore, even though the form of the above-described invention is merely a preferred or exemplary embodiment given with practical alternates, further variations may be made in the form, construction, and arrangement of the parts without departing from the scope of the above invention.

I claim:

1. In a mobile radio transceiver including a signal source such as a programmable multi-frequency synthesizer having a variable frequency and coupled to an isolation switch having means for switching said signal source between a fixed termination impedance load coupled to said isolation switch and a variable impedance load having at least two impedance states and that is variable about a desired (proper) impedance value coupled to said isolation switch, a method for said isolation switch switching said signal source from said fixed termination impedance load to said variable impedance load, including the steps of:

(a) sensing when said variable impedance load has changed between two impedance states and has reached an impedance value very nearly equal to its proper impedance value, (b) sensing when the frequency of said signal source has settled to its proper frequency value, and (c) responsive to said step (a) and step (b), switching said signal source from said fixed termination impedance load to said variable impedance load.

2. A mobile radio transceiver including a signal source such as a programmable multi-frequency synthesizer having a variable frequency and coupled by a first lead ("lead A") to an isolation switch having means for switching said signal source between a fixed termination impedance load coupled to said isolation switch by a second lead ("lead B") and a variable impedance load having at least two impedance states and that is variable about a desired (proper) impedance value coupled to said isolation switch by a third lead ("lead C"), said signal source, said variable impedance load, and said isolation switch responsive to a controller, said controller coupled to said isolation switch by a fourth lead ("lead D"), said controller having means for sensing when said variable impedance load has changed between two impedance states and has reached an impedance value very nearly equal to its proper impedance value as well as sensing when the frequency of said signal source has settled to its proper frequency value before activating switchover via said isolation switch from said fixed termination impedance load connected via said lead B to said variable impedance load connected via said lead C.

3. The mobile radio transceiver of claim 2 wherein said isolation switch includes a double-throw switch having an input, a first output and a second output, said input connected in series with said lead A, said first output connected in series with said lead B, said second output connected in series with said lead C.

4. The mobile radio transceiver of claim 2 wherein said isolation switch includes a double-throw relay such as a coaxial relay switch having an input, a first output and a second output, said input connected in series with said lead A, said first output connected in series with said lead B, said second output connected in series with said lead C.

5. The mobile radio transceiver of claim 2 wherein said isolation switch includes:

series circuit means connected in series with lead A and lead C for connecting said signal source to said variable impedance load;

shunt circuit means connected in series with lead A and lead B for connecting said signal source to said first impedance load; and bias circuit means coupled to said series circuit means and said shunt circuit means for selectively controlling the conductivity of said series circuit means and said shunt circuit means, said bias circuit means connected in series with lead D and responsive to a bias voltage present on lead D, said controller having means for selectively controlling said bias voltage present on lead D.

6. The mobile radio transceiver of claim 5, wherein said shunt circuit means includes a series combination of at least one PIN diode and a capacitor, paralleled with a resistor and connected to a transmission line having a characteric impedance substantially equal to said second predetermined value.

7. The mobile radio transceiver of claim 6, wherein said series circuit means includes a transmission line having a PIN diode connected to each end thereof.

8. The mobile radio transceiver of claim 7, wherein said fixed impedance load comprises a resistor of about 50 ohms.

9. The mobile radio transceiver of claim 7, wherein said fixed impedance load comprises a local oscillator injection circuit having an impedance of about 50 ohms.

10. The mobile radio transceiver of claim 7, wherein said variable impedance load comprises an input of an amplifier.

* * * * *